(12) United States Patent
Yee et al.

(10) Patent No.: US 7,456,051 B2
(45) Date of Patent: Nov. 25, 2008

(54) PHOTOELECTRIC DEVICE GRINDING PROCESS AND DEVICE GRINDING PROCESS

(75) Inventors: Kuo-Chung Yee, Taipei (TW); Chih-Lung Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 360 days.

(21) Appl. No.: 10/710,696

(22) Filed: Jul. 29, 2004

(65) Prior Publication Data

US 2005/0266601 A1    Dec. 1, 2005

(30) Foreign Application Priority Data

May 26, 2004   (TW) .............................. 93114874 A

(51) Int. Cl.
 *H01L 21/30* (2006.01)
(52) U.S. Cl. ............... 438/118; 438/456; 257/E21.237; 257/E21.484
(58) Field of Classification Search ................ 438/455, 438/456, 459, 118–119, 977, 690–693, 700, 438/959; 257/E21.237, E21.484
See application file for complete search history.

(56) References Cited

U.S. PATENT DOCUMENTS

| 4,565,928 | A  | * | 1/1986  | Yamamoto et al. ........ 250/208.3 |
| 5,101,099 | A  | * | 3/1992  | Funada et al. ............ 250/208.1 |
| 2004/0137723 | A1 | * | 7/2004  | Noma et al. ................. 438/667 |
| 2004/0232104 | A1 | * | 11/2004 | Kinoshita et al. ............. 216/23 |
| 2006/0030074 | A1 | * | 2/2006  | Mund et al. .................. 438/108 |
| 2006/0043555 | A1 | * | 3/2006  | Liu ............................ 257/680 |

* cited by examiner

*Primary Examiner*—Lynne Gurley
*Assistant Examiner*—Colleen Matthews
(74) *Attorney, Agent, or Firm*—Jianq Chyun IP Office

(57) ABSTRACT

A photoelectric device grinding process comprising the following steps is disclosed. A wafer comprising a plurality of chip units is provided. Each chip unit has at least a photoelectric device disposed on a surface layer. A dielectric substrate is attached to the wafer with glue having a plurality of spacers therein such that the photoelectric devices face the dielectric layer. The spacers maintain a gap between the dielectric substrate and the wafer. Thereafter, the dielectric substrate surface away from the wafer or the wafer surface away from the dielectric substrate or both is ground. The grinding process is particularly suitable for preventing any possible damage to the photoelectric devices on a wafer.

9 Claims, 3 Drawing Sheets

PHOTOELECTRIC DEVICE GRINDING PROCESS AND DEVICE GRINDING PROCESS

CROSS REFERENCE TO RELATED APPLICATIONS

This application claims the priority benefit of Taiwan application serial no. 93114874, filed May 26, 2004.

BACKGROUND OF INVENTION

1. Field of the Invention

The present invention relates to a device grinding process. More particularly, the present invention relates to a photoelectric device grinding process.

2. Description of the Related Art

In the present information age, electronic products have become indispensable part of our lives. We use electronic products in our work and in our home. In general, an integrated circuit device is at the core driving most electronic products. With the ever-advancing electronic technologies, more and more functionally powerful and personalized products are produced. Most of these electronic products can have a streamline, compact and miniature appearance largely due to a corresponding reduction in the size of semiconductor packages.

Due to the demand for small packages, the silicon wafer at the end of integrated circuit and device fabrication often has a thickness too large to fit into the package. Thus, before dicing up the silicon wafer, a tape is often attached to the active surface of the wafer and then the wafer is mounted to a polishing table to perform a grinding operation. After grinding the wafer to a thickness that meets the packaging requirement, the wafer is removed from the polishing table and the tape is removed from the wafer. Thereafter, another tape is attached to the back surface of the wafer before the wafer is cut into a plurality of independent chip units.

However, a delicate device such as the photoelectric device can be severely damaged if the aforesaid grinding process is deployed to reduce wafer thickness. In general, the photoelectric device has an image sensor or a micromechanical structure for fine tuning the radio frequency (RF) fabricated on the active surface of a silicon wafer using a semiconductor fabrication process or microelectromechanical technology. When a tape is used to mount the wafer on a polishing table, peeling the tape from the wafer surface at the end of the grinding process might cause severe damage to the micromechanical structures or the image sensors. Moreover, any tape residue left on the wafer after the tape peeling process might lower the yield of the photoelectric device. Furthermore, the photoelectric devices on the surface of the wafer need to be carefully protected during the grinding process. In addition, the mechanical strength of the silicon wafer will drop in accordance with the thickness of the wafer material removed in the grinding process. Hence, reducing the thickness of the wafer to a level suitable for packaging through a conventional grinding process is difficult.

Thus, there is a need for a method capable of grinding down the wafer to a suitable thickness without damaging the devices, especially, photoelectric devices or other micro-mechanical structures on the wafer surface.

SUMMARY OF INVENTION

Accordingly, at least one objective of the present invention is to provide a grinding process capable of preventing the photoelectric devices on a substrate from being damaged.

To achieve these and other advantages and in accordance with the purpose of the invention, as embodied and broadly described herein, the invention provides a photoelectric device grinding process that includes the following steps. First, a wafer having a plurality of chip units thereon is provided. Each chip unit has at least a photoelectric device disposed on a surface. Next, some glue having a plurality of spacers embedded therein is provided. Thereafter, a dielectric substrate is attached to the surface of the wafer having photoelectric devices thereon using the glue. The glue and the embedded spacers are disposed between the dielectric substrate and the wafer such that a gap is maintained between them through the spacers. Finally, the surface of the dielectric substrate away from the wafer, the surface of the wafer away from the dielectric substrate or both surfaces is ground.

In the present embodiment, the photoelectric device is an image sensor or a micro-mechanical structure having a portion protruding beyond the surface of the wafer by a height smaller than the gap between the dielectric substrate and the wafer.

The glue is an ultraviolet cured plastic or an epoxy, for example. The spacers are fabricated using silica, for example. The method of grinding the dielectric substrate and the wafer comprises performing a mechanical polishing process, for example. The dielectric substrate is a glass substrate or a silicon substrate, for example. Furthermore, the glue, each chip unit and the dielectric substrate together enclose at least a sealed space such that the photoelectric device is located within this sealed pace.

The present invention also provides a device grinding process that includes the following steps. First, a wafer having a plurality of chip units thereon is provided. Each chip unit has at least a device on a surface. Next, a dielectric substrate is attached to the surface of the wafer having devices thereon using some glue such that a gap is maintained between the dielectric substrate and the wafer. Finally, the surface of the dielectric substrate away from the wafer, the surface of the wafer away from the dielectric substrate or both surfaces is ground.

By gluing a dielectric substrate over the wafer to cover the photoelectric device prior to performing the grinding operation according to the present invention, the photoelectric devices is protected against possible damages resulting from any external process. Ultimately, overall yield of the photoelectric devices is increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1A:
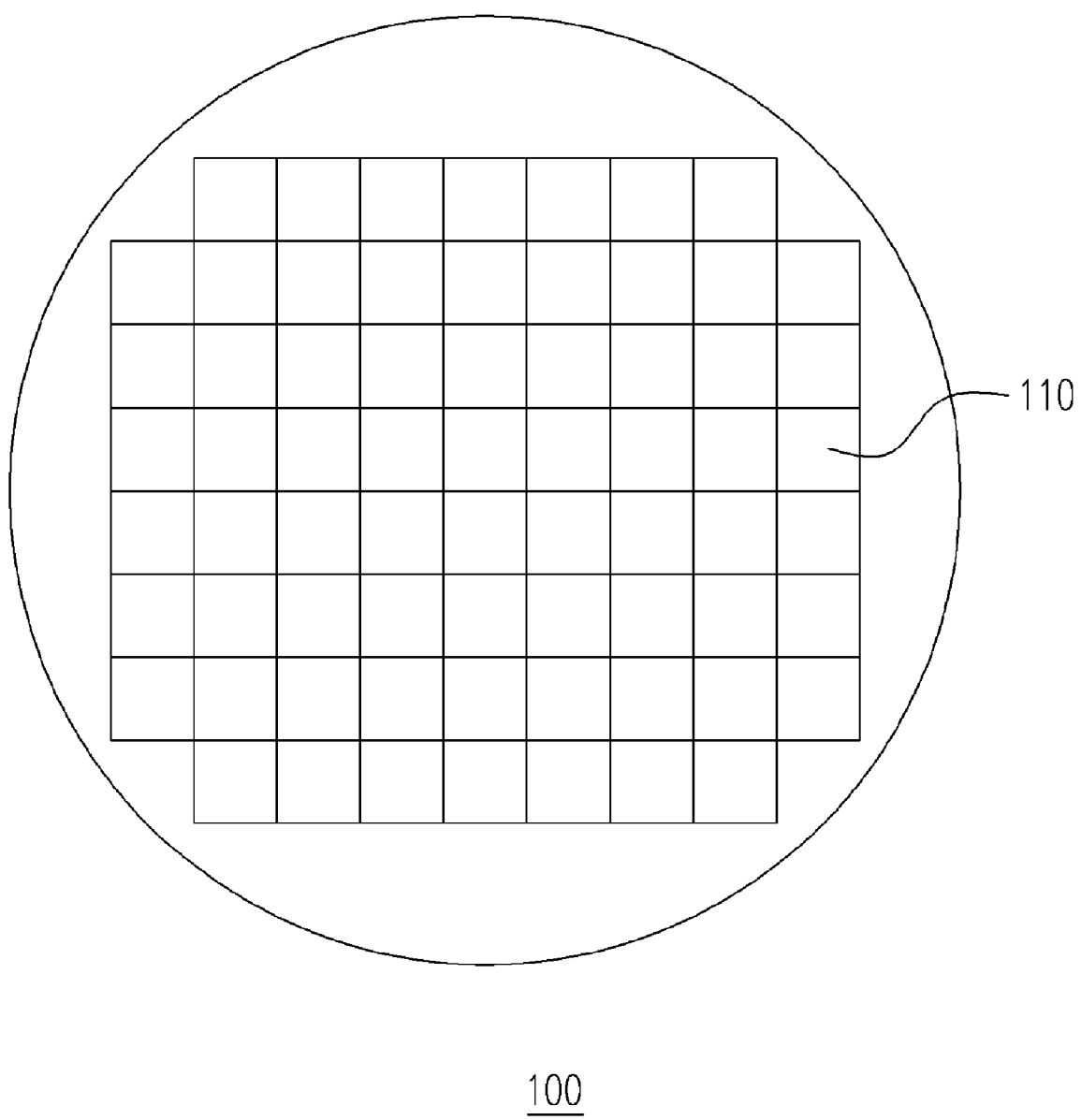
FIGS. 1A through 1D are schematic cross-sectional views showing the steps in a photoelectric device grinding process according to one preferred embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

The device grinding process according to the present invention includes the following steps. First, a wafer having a plurality of chip units thereon is provided. Each chip unit has at least a device disposed on a surface. Next, a dielectric substrate is attached to the surface of the wafer having devices thereon using some glue such that a gap is maintained between the dielectric substrate and the wafer. Thereafter, the surface of the dielectric substrate away from the wafer, the surface of the wafer away from the dielectric substrate or both surfaces is ground. Since the dielectric substrate is hanged over the devices on the surface of the wafer and separated from the wafer by a gap, the devices are protected against possible damage throughout the grinding process. There are a number of methods for maintaining a gap between the dielectric substrate and the wafer. In the following, the device grinding process is applied to a wafer having photoelectric devices thereon. In other words, a photoelectric device grinding process is described.

Figure 1B:
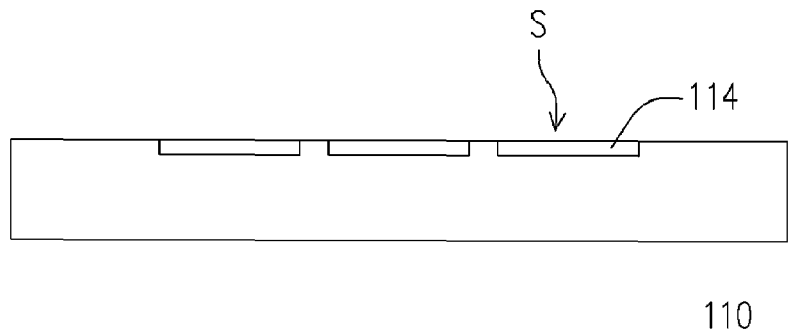
Figure 1C:
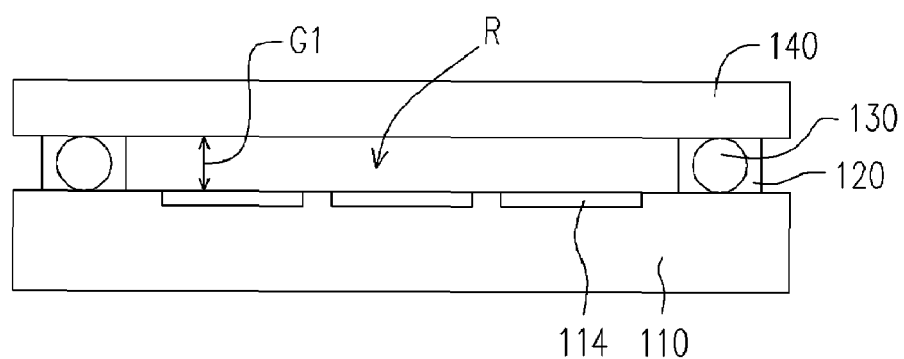
Figure 1D:
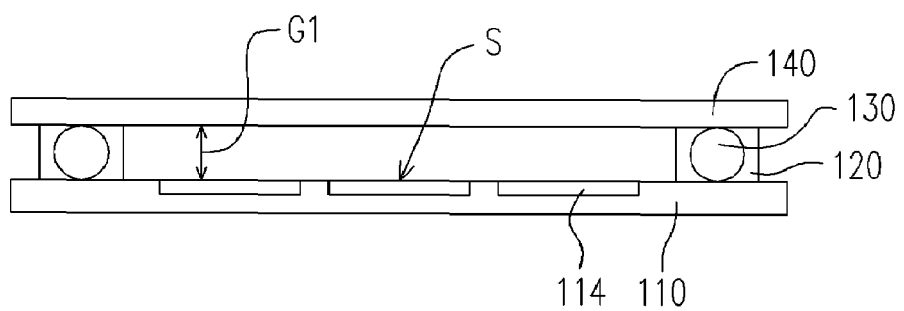

FIGS. 1A through 1D are schematic cross-sectional views showing the steps in a photoelectric device grinding process according to one preferred embodiment of the present invention. As shown in FIG. 1A, a wafer 100 such as a silicon wafer is provided. The wafer 100 has a plurality of chip units 110 thereon. In FIGS. 1B to 1D, only a single chip unit 110 is drawn for clarity. In practice, the entire wafer 100 is ground in the photoelectric device grinding process.

As shown in FIG. 1B, the top surface of each chip unit 110 has at least a photoelectric device 114. The photoelectric devices 114 are formed on the top surface of the wafer 100 using conventional semiconductor fabrication techniques. The photoelectric devices 114 can be charge-coupled devices (CCD), complementary metal-oxide-semiconductor (CMOS) devices or other image-sensing devices, for example. The exposed surface of the photoelectric devices 114 is an active surface S. Since image signals are produced only when external light rays are able to impinge upon the active surface S of the photoelectric devices 114, cleanliness of the active surface S is of utmost importance. Thus, any scratches or dirt on the active surface S is detrimental to the performance of the photoelectric device 114.

As shown in FIG. 1C, some glue 120 and a dielectric substrate 140 is provided. The glue 120 has a plurality of spacers 130 embedded inside. Thereafter, the dielectric substrate 140 is bonded to the surface of the wafer 100 (only one chip unit 110 is shown) where the photoelectric devices are located. The glue 120 and the embedded spacer 130 are disposed between the dielectric substrate 140 and the chip unit 110. The glue 120 is fabricated from an ultraviolet cured plastic or an epoxy material, for example. After joining the dielectric substrate 140 and the chip units 110 together, the glue 120 is cured by illuminating with ultraviolet light, baking or performing some other process so that unwanted separation in a subsequent grinding process is prevented. The spacers 130 mixed inside the glue 120 serve to maintain a gap G1 between the dielectric spacer 140 and the chip unit 110. Preferably, the gap G1 is large enough to prevent the dielectric substrate 140 from touching the photoelectric device 114. The glue 120, the chip unit 110 and the dielectric substrate 140 together form a sealed chamber R such that the dielectric devices 114 are located within the chamber R. The spacers 130 are fabricated using silicon oxide or some other materials, for example. Preferably, the spacers 130 are uniform in size and round in shape to ensure a constant gap G1 is always provided between the chip unit 110 and the dielectric substrate 140. The dielectric substrate 140 is a glass substrate or other transparent substrate, for example. The principal selection criterion of the dielectric substrate 140 is the capacity to match the high image-sensing performance of the photoelectric device 114.

As shown in FIG. 1D, the surface of the dielectric substrate 140 away from the chip unit 110, the surface of the chip unit 110 away from the dielectric substrate 140 or both surfaces is ground. The grinding method includes a mechanical grinding process, for example.

With the aforesaid setup, an adhesive tape can be freely applied to the dielectric substrate 140 or the back surface of the chip unit 110 to station the wafer on a polishing table before grinding without having to worry about possible damage to the photoelectric devices. Furthermore, the dielectric substrate 140 also reinforces the chip unit 110 by producing a two-layered structure so that a thicker layer can be removed from the dielectric substrate 140 or the chip unit 110 to obtain a thinner final product.

Figure 2A:
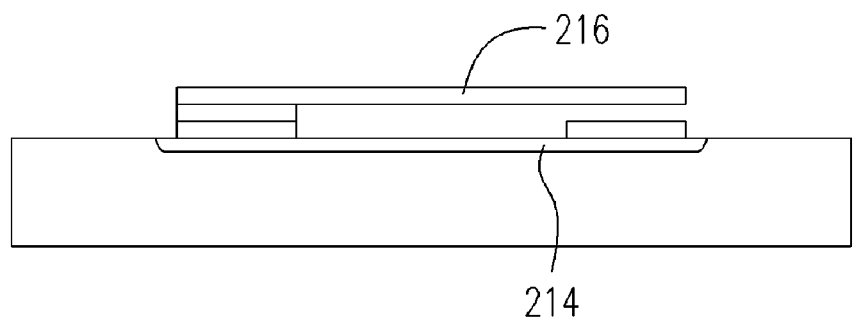
FIGS. 2A through 2C are schematic cross-sectional views showing the steps in a photoelectric device grinding process according to another preferred embodiment of the present invention.
Figure 2B:
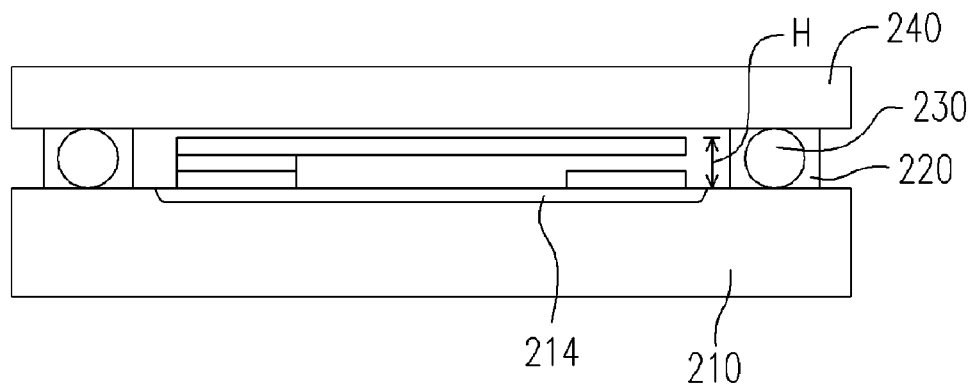
Figure 2C:
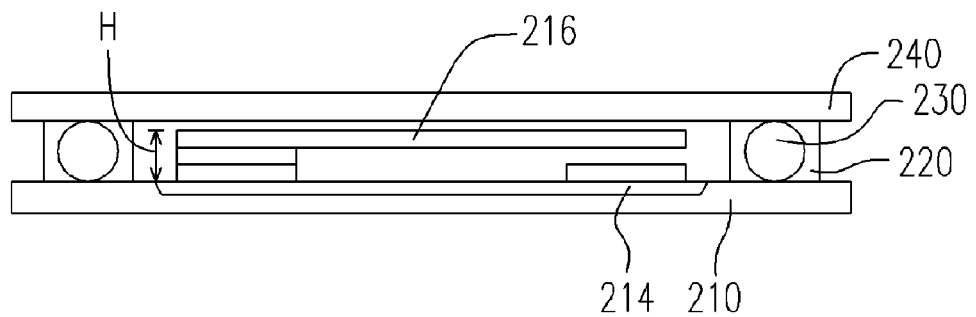

FIGS. 2A through 2C are schematic cross-sectional views showing the steps in a photoelectric device grinding process according to another preferred embodiment of the present invention. In this embodiment, only the photoelectric device on the wafer is different. As shown in FIG. 2A, a wafer having a plurality of chip units 210 thereon similar to the one in FIG. 1A is provided. The surface of each chip unit 210 has at least a photoelectric device 214. The photoelectric device 214 is, for example, a micromechanical structure 216 fabricated on a surface layer of the chip unit 210 using a micro-electromechanical technology. A portion of the micro-mechanical structure 216 protrudes from the surface of the chip unit 210 to a height H. The photoelectric device 214 is a radio frequency modulation device or other devices having a micromechanical structure.

As shown in FIG. 2B, a dielectric substrate 240 is bonded to the surface of the chip unit 210 where the photoelectric device 214 are located using some glue 220. The dielectric substrate 240 is a glass substrate, a silicon substrate or other dielectric material substrate. Preferably, a plurality of spacers 230 is embedded within the glue 220 so that a constant gap G2 is maintained between the dielectric substrate 240 and the chip unit 210. Furthermore, the gap G2 is greater than the height H of the micromechanical structure 216 above the chip unit 210.

As shown in FIG. 2C, the surface of the dielectric substrate 240 away from the chip unit 210, the surface of the chip unit 210 away from the dielectric substrate 240 or both surfaces are ground.

In summary, a dielectric substrate is glued onto the wafer to cover the photoelectric device prior to performing the grinding operation. Hence, adhesive tapes can be freely applied to the dielectric substrate or the back surface of the chip unit to station the wafer on a polishing table before grinding without having to worry about possible damage to the photoelectric devices. Obviously, the dielectric substrate and the glue also provide a barrier against any perpetration of foreign material and moisture. Furthermore, the spacers also set up a constant gap between the dielectric substrate and the wafer to prevent possible damage due to contact with the photoelectric device. The dielectric substrate and the chip unit together also form a stronger two-layered structure so that a thicker layer can be removed from the dielectric substrate or the chip unit to obtain a thinner final product. Thus, the photoelectric devices on the wafer are protected against possible damages resulting from any external process and overall yield of the photoelectric devices is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A photoelectric device grinding process, comprising the steps of:

providing a wafer having a plurality of chip units thereon, wherein the surface of each chip unit has at least a photoelectric device;

providing an amount of glue with a plurality of spacers therein;

attaching a dielectric substrate over the photoelectric device on the surface of the wafer through the glue, wherein the glue and the spacers are disposed between the dielectric substrate and the wafer and both of the glue and the spacers are directly contacted with the dielectric substrate and the wafer, such that the spacers maintain a constant gap between the dielectric substrate and the wafer and the spacers are surrounded by the glue except for the portion of the spacers directly contacting the dielectric substrate and wafer; and after attaching the dielectric substrate over the photoelectric device on the surface of the wafer, grinding the surface of the dielectric substrate away from the wafer or the surface of the wafer away from the dielectric substrate.

2. The photoelectric device grinding process of claim 1, wherein the photoelectric device comprises an image sensor.

3. The photoelectric device grinding process of claim 1, wherein the glue comprises ultraviolet cured plastic.

4. The photoelectric device grinding process of claim 1, wherein the material constituting the spacers comprises silicon oxide.

5. The photoelectric device grinding process of claim 1, wherein the step of grinding the dielectric substrate or the wafer comprises mechanical grinding.

6. The photoelectric device grinding process of claim 1, wherein the dielectric substrate comprises a glass substrate or a silicon substrate.

7. The photoelectric device grinding process of claim 1, wherein the glue, each chip unit and the dielectric substrate together form at least a sealed chamber such that the photoelectric device is enclosed within the sealed chamber.

8. The photoelectric device grinding process of claim 1, wherein the photoelectric device comprises a micro-mechanical structure.

9. The photoelectric device grinding process of claim 8, wherein the micro-mechanical structure protrudes from the surface of the wafer by a height smaller than the gap between the dielectric substrate and the wafer.

* * * * *